United States Patent
Ishii et al.

(10) Patent No.: US 11,782,003 B2
(45) Date of Patent: Oct. 10, 2023

(54) METHOD FOR MEASURING ACID ANHYDRIDE CONTENT

(71) Applicant: Nippon Telegraph and Telephone Corporation, Tokyo (JP)

(72) Inventors: Azusa Ishii, Tokyo (JP); Takashi Miwa, Tokyo (JP); Masamitsu Watanabe, Tokyo (JP); Soichi Oka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 360 days.

(21) Appl. No.: 17/292,502

(22) PCT Filed: Dec. 13, 2019

(86) PCT No.: PCT/JP2019/048937
§ 371 (c)(1),
(2) Date: May 10, 2021

(87) PCT Pub. No.: WO2020/137622
PCT Pub. Date: Jul. 2, 2020

(65) Prior Publication Data
US 2022/0003699 A1    Jan. 6, 2022

(30) Foreign Application Priority Data
Dec. 28, 2018    (JP) .................. 2018-246651

(51) Int. Cl.
*G01N 24/08*    (2006.01)

(52) U.S. Cl.
CPC .................. *G01N 24/088* (2013.01)

(58) Field of Classification Search
CPC ....... G01N 24/088; G01N 24/08; G01R 33/46
See application file for complete search history.

(56) References Cited

U.S. PATENT DOCUMENTS

2010/0108367 A1*  5/2010  Furushita ............ C08F 283/002
                                                        524/145

OTHER PUBLICATIONS

Hajime Ooya et al., Analytical Chemistry Practical Series Applied Analysis 4 Polymer Analysis, Kyoritsu Shuppan Co., Ltd., 2013, pp. 67-69, 86-87.
T. Grossetete et al., "Photochemical degradation of poly(ethyleneterephthalate)-modified copolymer," Polymer, vol. 41, 2000, pp. 3541-3554.

* cited by examiner

*Primary Examiner* — G. M. A Hyder
(74) *Attorney, Agent, or Firm* — Slater Matsil, LLP

(57) ABSTRACT

In a first step, a sample formed of a polyester or decomposition products of a polyester is dissolved in a pretreatment liquid containing 1,1,1,3,3,3-hexafluoro-2-propanol and an organic base to produce a reaction product of the sample, and in a second step, the obtained reaction product is mixed into a solvent (measurement solvent) containing deuterated chloroform and deuterated 1,1,1,3,3,3-hexafluoro-2-propanol to fabricate a sample liquid. Next, in a third step, the amount of the reaction product in the sample liquid is measured through NMR aiming at hydrogen atoms to determine the amount of an acid anhydride structure in the sample.

12 Claims, 1 Drawing Sheet

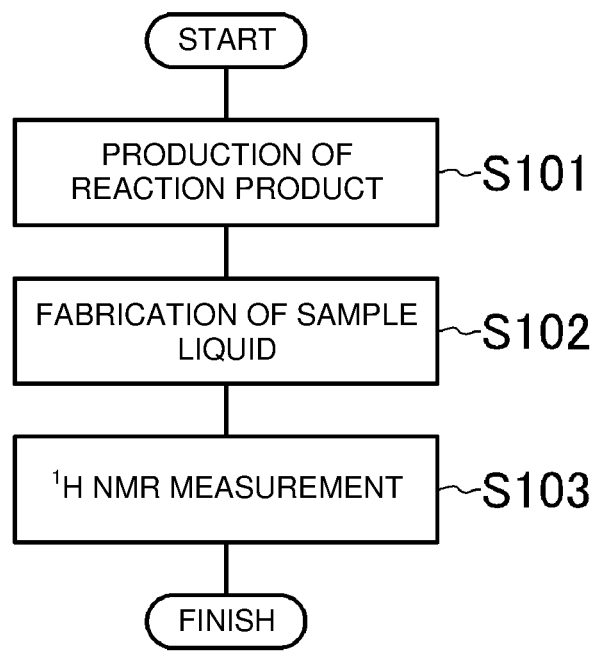

US 11,782,003 B2

METHOD FOR MEASURING ACID ANHYDRIDE CONTENT

CROSS-REFERENCE TO RELATED APPLICATIONS

This application is a national phase entry of PCT Application No. PCT/JP2019/048937, filed on Dec. 13, 2019, which claims priority to Japanese Application No. 2018-246651, filed on Dec. 28, 2018, which applications are hereby incorporated herein by reference.

TECHNICAL FIELD

The present invention relates to a method for measuring the acid anhydride content, and more particularly, to a method for measuring the content of acid anhydride in a degraded polyester.

BACKGROUND

Polyesters having thermoplasticity (thermoplastic polyesters) have both strength and flexibility, and are utilized in a variety of applications as engineering plastics. For example, polyethylene terephthalate (PET), which is a thermoplastic polyester, is utilized in films, fibers, and bottles for beverages, some of which are also recycled.

Degradation of thermoplastic polyesters progresses due to heat or light, and it is industrially important to grasp the state of this degradation. Thermoplastic polyesters that have been degraded by light or heat are in a state of containing an acid anhydride structure (Non-Patent Literature 1). When this acid anhydride structure is hydrolyzed, the strength of the material is reduced due to breakage of the molecular chain, and therefore, it can be said that the content of the acid anhydride structure is an important indicator for evaluating the degradation of thermoplastic polyesters.

However, even when using either an infrared spectroscopy (IR measurement), which is effective in quantitative measurement of the molecular structure of polymers, or a nuclear magnetic resonance spectroscopy aiming at hydrogen atoms (1H NMR measurement), it is difficult to measure the content of the acid anhydride structure in thermoplastic polyesters through existing methods.

The IR measurement can detect the acid anhydride structure contained in degraded thermoplastic polyesters (Non-Patent Literature 1). However, in order to convert the peak intensity of the infrared absorption spectrum obtained by the IR measurement into the concentration, it is necessary to obtain a calibration curve by measuring a standard sample in which the concentration of the molecular structure to be measured has been known (Non-Patent Literature 2, pp. 68 and 69). It is difficult to acquire standard samples of thermoplastic polyesters that contain the acid anhydride structure, which is a product due to the degradation of thermoplastic polyesters, at an arbitrary concentration; therefore, it is hard to quantify the content of the acid anhydride structure by the IR measurement.

In contrast, the 1H NMR measurement allows the concentration to be calculated from the ratio of integrated values of the proton spectrum and does not require a standard sample for quantitative measurement. However, there has been no reported case where the acid anhydride structure contained in degraded thermoplastic polyesters is measured by 1H NMR. As a general measurement condition for thermoplastic polyesters, a mixed solvent of deuterated chloroform ($CDCl_3$) and 1,1,1,3,3,3-hexafluoro-2-propanol-2d (HFIP-2d), or a mixed solvent of deuterated chloroform ($CDCl_3$) and trifluoroacetic acid-d (TFA-d) has been used as a solvent in which the sample thermoplastic polyester is dissolved (Non-Patent Literature 2, pp. 86 and 87). 1,1,1,3,3,3-hexafluoro-2-propanol-2d (HFIP-2d) is deuterated 1,1,1,3,3,3-hexafluoro-2-propanol.

However, in the measurement using these solvents, the peak derived from the acid anhydride structure cannot be detected because the peak derived from the acid anhydride structure overlaps with another peak derived from a component of the solvent.

Alternatively, as a method for quantitatively measuring the aromatic carboxylic acid terminal of thermoplastic polyesters, a method is also known in which the sample thermoplastic polyester is dissolved in a mixed solvent of deuterated chloroform ($CDCl_3$) and 1,1,1,3,3,3-hexafluoro-2-propanol-2d (HFIP-2d), an amine is added to this mixed solution, the mixed solution to which the amine has been added is heated, and the aromatic carboxylic acid terminal of the thermoplastic polyester is subjected to quantitative measurement. In this measurement, the acid anhydride structure is decomposed and it is difficult to detect and quantify peaks derived from the decomposition products separately from peaks of other components.

CITATION LIST

Non-Patent Literature

Non-Patent Literature 1: T. Grossetete et al., "Photochemical degradation of poly(ethylene terephthalate)-modified copolymer", Polymer, vol. 41, pp. 3541-3554, 2000.

Non-Patent Literature 2: Hajime Ohtani, Nobuyuki Sato, Shigeru Takayama, Hironori Matsuda, and Yukitaka Goto, "The Japan Society for Analytical Chemistry, Applied Analysis 4", edited by The Japan Society for Analytical Chemistry, supervised by Hiroki Haraguchi, Hideyuki Ishida, Hajime Ohtani, Koji Suzuki, Hiroko Seki, and Hitoshi Watarai, published in 2013.

SUMMARY

Technical Problem

As described above, the conventional measurement methods have the problem of not being able to measure the content of acid anhydride in the degraded polyester.

Embodiments of the present invention have been made in order to solve the problem as described above, and an object of embodiments of the present invention is to enable measurement of the content of acid anhydride in the degraded polyester.

Means for Solving the Problem

A method for measuring the acid anhydride content according to embodiments of the present invention comprises: a first step of dissolving a sample formed of a polyester or decomposition products of a polyester in a pretreatment liquid containing 1,1,1,3,3,3-hexafluoro-2-propanol and an organic base to obtain a reaction product of the sample; a second step of mixing the reaction product into a solvent containing deuterated chloroform and deuterated 1,1,1,3,3,3-hexafluoro-2-propanol to fabricate a sample liquid; and a third step of measuring the amount of the reaction product in the sample liquid through a nuclear magnetic resonance spectroscopy aiming at hydrogen atoms to determine the amount of an acid anhydride structure in the sample.

In one configuration example of the above method for measuring the acid anhydride content, the organic base is at least one of a tertiary amine and a heterocyclic amine.

In one configuration example of the above method for measuring the acid anhydride content, in the first step, after obtaining the reaction product, the pretreatment liquid in which the reaction product is dissolved is concentrated; in the second step, the concentrated pretreatment liquid in which the reaction product is dissolved is mixed into the solvent to fabricate the sample liquid; and the mass W of the concentrated pretreatment liquid satisfies a relationship of $0.1 \leq w/W \leq 0.5$ relative to the mass w of the sample.

In one configuration example of the above method for measuring the acid anhydride content, the measurement of the amount of the reaction product in the sample liquid through a nuclear magnetic resonance spectroscopy aiming at hydrogen atoms is conducted, setting the temperature of the sample liquid at 30° C. or higher and 50° C. or lower.

Effects of Embodiments of the Invention

As described above, according to embodiments of the present invention, a sample formed of a polyester or decomposition products of a polyester is dissolved in a pretreatment liquid containing 1,1,1,3,3,3-hexafluoro-2-propanol and an organic base to obtain a reaction product of the sample, which enables the content of acid anhydride in the degraded polyester to be measured.

BRIEF DESCRIPTION OF THE DRAWINGS

FIG. 1 is a flowchart for describing a method for measuring the acid anhydride content according to an embodiment of the present invention.

DETAILED DESCRIPTION OF ILLUSTRATIVE EMBODIMENTS

Hereinafter, a method for measuring the acid anhydride content according to an embodiment of the present invention will be described with reference to FIG. 1.

At first, in a first step S101, a sample formed of a polyester (thermoplastic polyester) or decomposition products of a polyester is dissolved in a pretreatment liquid containing 1,1,1,3,3,3-hexafluoro-2-propanol and an organic base to produce (obtain) a reaction product of the sample (decomposition product of an acid anhydride structure). As the organic base, a tertiary amine or a heterocyclic amine can be used. Note that the treatment of the first step will be referred to as a "pretreatment" in the following sections.

A solution obtained by adding an organic base to 1,1,1,3,3,3-hexafluoro-2-propanol (HFIP) is used as the pretreatment liquid, and by dissolving a sample of thermoplastic polyester containing an acid anhydride structure in this pretreatment liquid, the acid anhydride structure (1) is chemically converted in a selective manner by the following reaction (A) or reaction (B), and compounds (2), (3), (4), and (5), which are the reaction products (decomposition products) of the acid anhydride structure, can be obtained. Note that R1 is an aromatic ring and R2 is an aliphatic hydrocarbon.

Formula 1

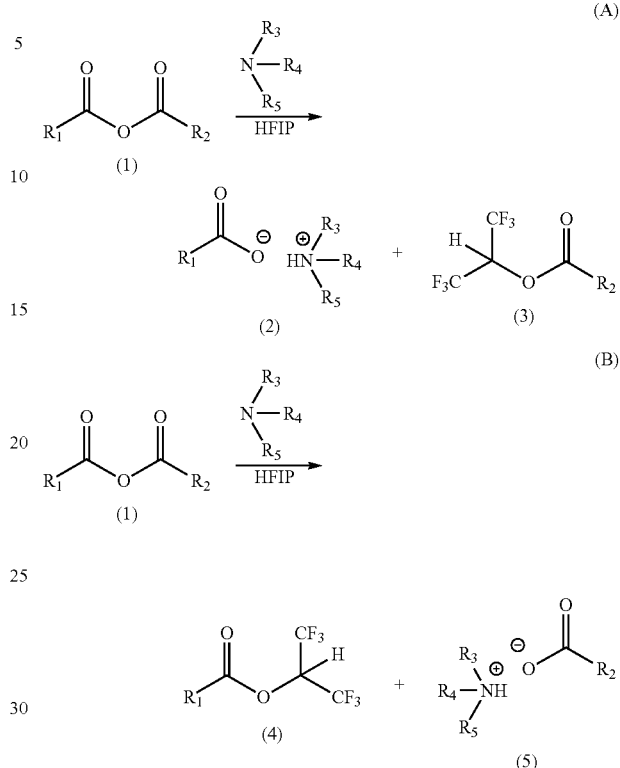

Subsequently, in a second step S102, the obtained reaction product is mixed into a solvent (measurement solvent) containing deuterated chloroform and deuterated 1,1,1,3,3,3-hexafluoro-2-propanol to fabricate a sample liquid. In this step, the pretreatment liquid in which the produced reaction product is dissolved is concentrated, and this concentrated pretreatment liquid is mixed into the measurement solvent to fabricate the sample liquid. Here, the concentration mentioned above is conducted to a degree where the pretreatment liquid remains to some extent and the entire reaction product is maintained to be dissolved in the pretreatment liquid without being solidified. The details of this concentration will be mentioned later.

Next, in a third step S103, the amount of the reaction product (decomposition product) in the sample liquid is measured through a nuclear magnetic resonance spectroscopy (NMR) aiming at hydrogen atoms to determine the amount of the acid anhydride structure in the sample. In the third step S103, the amount of the decomposition product of the acid anhydride structure mentioned above is measured through a nuclear magnetic resonance spectroscopy aiming at hydrogen atoms to determine the amount of the acid anhydride structure in the sample liquid. Based on the obtained amount (total amount) of the acid anhydride structure, the degradation of the measured sample (polyester) is determined. For example, if the measurement results of the acid anhydride structure of the sample to be determined for degradation are increased to or above the reference value, the sample under consideration can be determined to be degraded.

EXAMPLES

Hereinafter, more detailed description will be given using Examples.

Sample

Sample 1: Polyethylene terephthalate, about 2.7 mg.

Sample 2: A low molecular compound with an acid anhydride structure represented by the following chemical formula (6), about 3 mg.

Sample 3: A decomposition product of the chemical formula (6) by HFIP represented by the following chemical formula (7), about 3 mg.

Sample 4: A decomposition product of the chemical formula (6) by HFIP represented by the following chemical formula (8), about 3 mg.

Sample 5: A polyethylene terephthalate containing an acid anhydride structure (decomposition products of a polyester), about 3 mg.

Formula 2

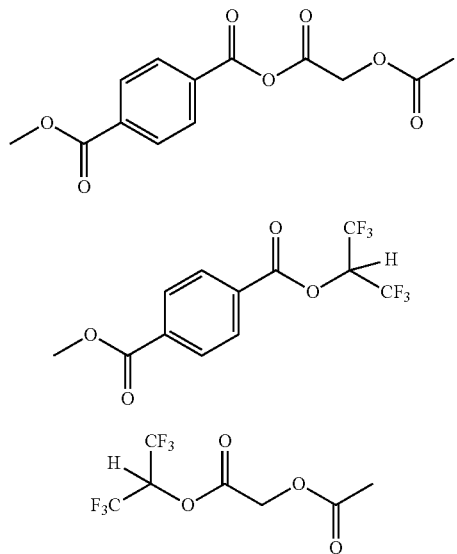

(6)

(7)

(8)

Pretreatment Liquid

To undeuterated 1,1,1,3,3,3-hexafluoro-2-propanol (HFIP), represented by the following chemical formula, triethylamine (tertiary amine) or pyridine (heterocyclic amine) was added, which was used as the pretreatment liquid.

Formula 3

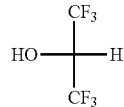

Measurement Solvent for Fabricating Sample Liquid

Measurement solvent 1: A solution obtained by mixing deuterated chloroform ($CDCl_3$) containing $Me_4Si$ at 0.03% (v/v) and deuterated 1,1,1,3,3,3-hexafluoro-2-propanol-2d (HFIP-2d) in a volume ratio of 1:1.

Measurement solvent 2: A solution obtained by mixing $CDCl_3$ containing $Me_4Si$ at 0.03% (v/v) and deuterated trifluoroacetic acid-d (TFA-d) in a volume ratio of 10:1.

Measurement solvent 3: A solution obtained by mixing $CDCl_3$ containing $Me_4Si$ at 0.03% (v/v) and HFIP-2d in a volume ratio of 1:1 to obtain a solution and then adding about 3 mg of isopropylamine to 1.0 mL of the resultant solution.

NMR Measurement

For each of the fabricated samples, 1H NMR (300 MHz) was measured with a nuclear magnetic resonance device, Oxford, from Varian, Inc. Each sample was dissolved in each measurement solvent (about 0.9 mL) and the measurement was conducted at T° C. The chemical shift δ was expressed in ppm, with the peak of $Me_4Si$ being 0 ppm.

Peak to be Measured

Protons (a) of the aromatic ring in the repeated structure of a polyester represented by the following chemical formula (α).

Protons (b) of the methylene group at the a position of the ester bond in the repeated structure of the polyester represented by the chemical formula (α).

Protons (c) and (c') of the a min derivative of the carboxylic acid terminal of a polyester represented by the following chemical formula (β).

Protons (d) and (d') of the aromatic ring in an acid anhydride structure represented by the following chemical formula (6).

Protons (e) of the methylene group at the a position of the acid anhydride structure represented by the chemical formula (6).

Protons (f) derived from HFIP represented by the following chemical formula (7).

Protons (g) derived from HFIP represented by the following chemical formula (8).

Protons (h) derived from HFIP in a decomposition product of an acid anhydride structure in a polyester represented by the following chemical formula (9).

Protons (i) and (i') of the aromatic ring in a decomposition product of an acid anhydride structure in a polyester represented by a chemical formula (9).

Protons (j) derived from HFIP in a decomposition product of an acid anhydride structure in a polyester represented by the following chemical formula (10).

Formula 4

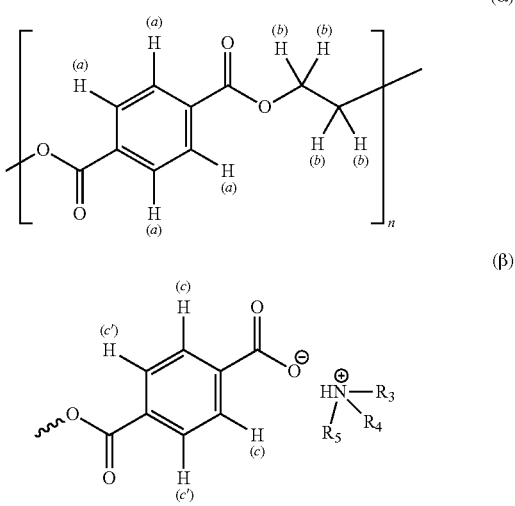

(α)

(β)

Formula 5

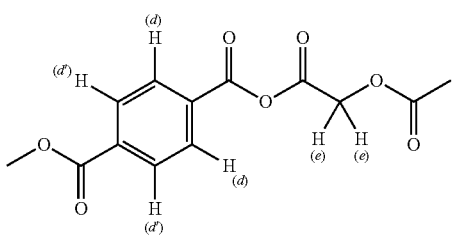
(6)

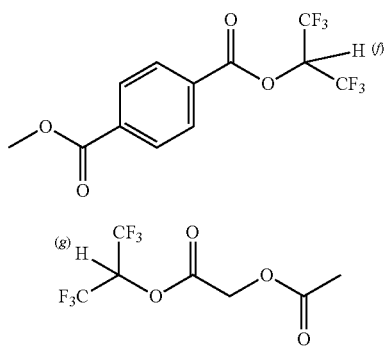
(7)

(8)

Formula 6

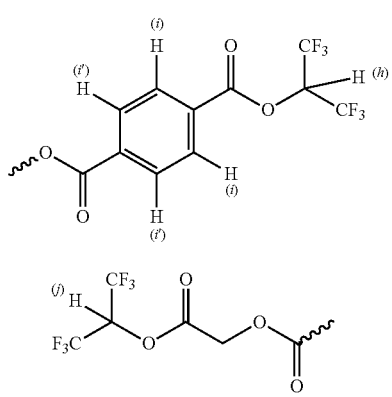
(9)

(10)

Study 1

Next, the peak detection position for measuring the decomposition product of the acid anhydride structure is studied. In this study, the peak detection position of protons derived from the acid anhydride structure in the existing NMR measurement method and the peak detection position of protons derived from a thermoplastic polyester are compared.

The sample 1 and the sample 2 were each dissolved in the measurement solvent 1, the measurement solvent 2, and the measurement solvent 3. For the samples dissolved in the measurement solvent 1 and the measurement solvent 3, the 1H NMR measurement was carried out at T=50° C., and for the samples dissolved in the measurement solvent 2, the measurement was carried out at T=25° C. The results obtained by the above measurement, comparing the peak detection position of protons derived from the acid anhydride structure and the peak detection position of protons derived from the thermoplastic polyester, are shown in Table 1.

In the case of using the measurement solvent 1 and the measurement solvent 2, the peaks of the protons in the acid anhydride structure were all detected at the same positions as the peaks of the protons in the thermoplastic polyester. In addition, when the sample 2 was measured using the measurement solvent 3, several peaks of the protons in the aromatic ring were confirmed, indicating that the acid anhydride structure was decomposed, and most of the peaks of the decomposition products were detected at the same positions as the peaks of the thermoplastic polyester. From the above results, it was found that it is difficult to detect the acid anhydride structure contained in the thermoplastic polyester under the existing NMR measurement conditions.

TABLE 1

Comparison of the peak detection positions of protons derived from the low molecular model compound with the acid anhydride structure and protons derived from the thermoplastic polyester in the existing NMR measurement approach

| Measurement conditions | (d) and (d') of (sample 2) | (e) of (sample 2) |
|---|---|---|
| (Measurement solvent 1) T = 50° C. | δ8.10: the same position as (a) of (sample 1) | δ4.71: the same position as (b) of (sample 1) |
| (Measurement solvent 2) T = 25° C. | δ8.09: the same position as (a) of (sample 1) | δ4.70: the same position as (b) of (sample 1) |
| (Measurement solvent 3) T = 50° C. | δ8.15: the same position as (a) of (sample 1) δ7.93: the same position as (c) of (sample 1) δ7.74: not overlapping with peaks of (sample-1) | δ4.70: the same position as (e) of (sample 1) |

Method for Quantifying Acid Anhydride Structure

As a result of the study and discussion by the study 1 mentioned above, the molar concentration C [mol %] of the acid anhydride structure relative to the entire terephthalic acid structure in each sample was calculated using the integrated values of the peaks of any of the aforementioned protons obtained by NMR measurements for the decomposition product as "$C=4\times\{(h)+(j)\}/\{(a)+(c)+(c')+(i)+(i')\}\times 100$ . . . (concentration calculation equation)".

Study 2—(Study on Pretreatment Method for Low Molecular Model Compound with Acid Anhydride Structure)

Next, the results of the study on the sample liquid fabricated in the second step will be described. The present inventors studied the conversion of the acid anhydride structure to a compound that can be detected by the 1H NMR measurement through pretreatment. In order to make the acid anhydride structure detectable by the 1H NMR measurement, it must be converted to a compound having a peak that is clearly distinguishable from the peaks of the thermoplastic polyester and the measuring solvent. In addition, in the process of the conversion mentioned above, the ester groups contained in the repeating units of the thermoplastic polyester and the carboxyl group and the hydroxyl group, which are the terminal functional groups of the thermoplastic polyester, must not be converted into the same compound as the compound after the conversion of the acid anhydride structure.

The present inventors have made diligent studies on the chemical conversion that satisfies the requirements mentioned above, and have come to study and verify by experiments a method in which the acid anhydride structure is converted into the compound (3) and the compound (4) by the reaction (A) and the reaction (B) and the protons derived from HFIP of the compound (3) and the compound (4) are detected. This method is not readily analogized because HFIP is not generally used for chemical modification and also because the stability of the compound (3) and the compound (4) is not expected to be high.

In a solution obtained by adding triethylamine to HFIP, 3 mg of the sample 2 (compound 6) was dissolved by stirring for 5 minutes, and this solution was volatilized and removed to obtain about 3 mg of a solid. The obtained solid was dissolved in deuterated chloroform and subjected to a 1H NMR measurement at T=25° C.; however, the target compounds (7) and (8) were not obtained, and the peaks of the following compound (ii) and compound (12) were detected. All peaks of the compound (ii) and the compound (12) are difficult to distinguish from the peak of thermoplastic polyester, and it was found that this method cannot detect the peak derived from the acid anhydride structure. The reason why the compound (7) and the compound (8) were not obtained by the method described above is thought to be because, after the acid anhydride structure was converted into the compound (7) and the compound (8) by the reaction (A) and the reaction (B), HFIP was desorbed during the process of volatilization of the solvent.

Formula 7

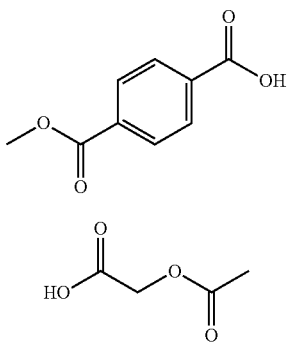

(11)

(12)

Study 3

In the study 2, HFIP was almost completely volatilized after the decomposition of the acid anhydride structure; however, since the HFIP-derived portions of the compound (7) and the compound (8) are believed to have been desorbed during the above process, it was studied to concentrate the solution such that a small amount of HFIP was preserved. In general, when the chemical conversion of a functional group is carried out in a pretreatment, the reaction reagent and the solvent in the pretreatment are removed before the desired measurement is carried out, and therefore, the present method, in which the desired measurement is conducted with a small amount of HFIP being preserved, cannot be readily analogized.

In a solution obtained by adding triethylamine to HFIP, 3 mg of the sample 2 was dissolved by stirring for 5 minutes, and this solution was volatilized and concentrated to about 12 mg of a solution. When this concentrated solution was dissolved in deuterated chloroform and subjected to the 1H NMR measurement at T=25° C., the peaks of HFIP as well as the compound (7), the compound (8), the compound (13), and the compound (14) were detected, and it was confirmed that the reaction (A') and the reaction (B') shown below proceeded quantitatively. In addition, the proton peak (f) and the proton peak (g) of the HFIP portion of the compound (7) and the compound (8) were both detected in the vicinity of 5.96 ppm, which was confirmed to be distinguishable from the peaks derived from the thermoplastic polyester and the solvent. Note that the peaks of the compound (7) and the compound (8) were confirmed by measuring the sample 3 and the sample 4, using deuterated chloroform as the solvent for each case.

Formula 8

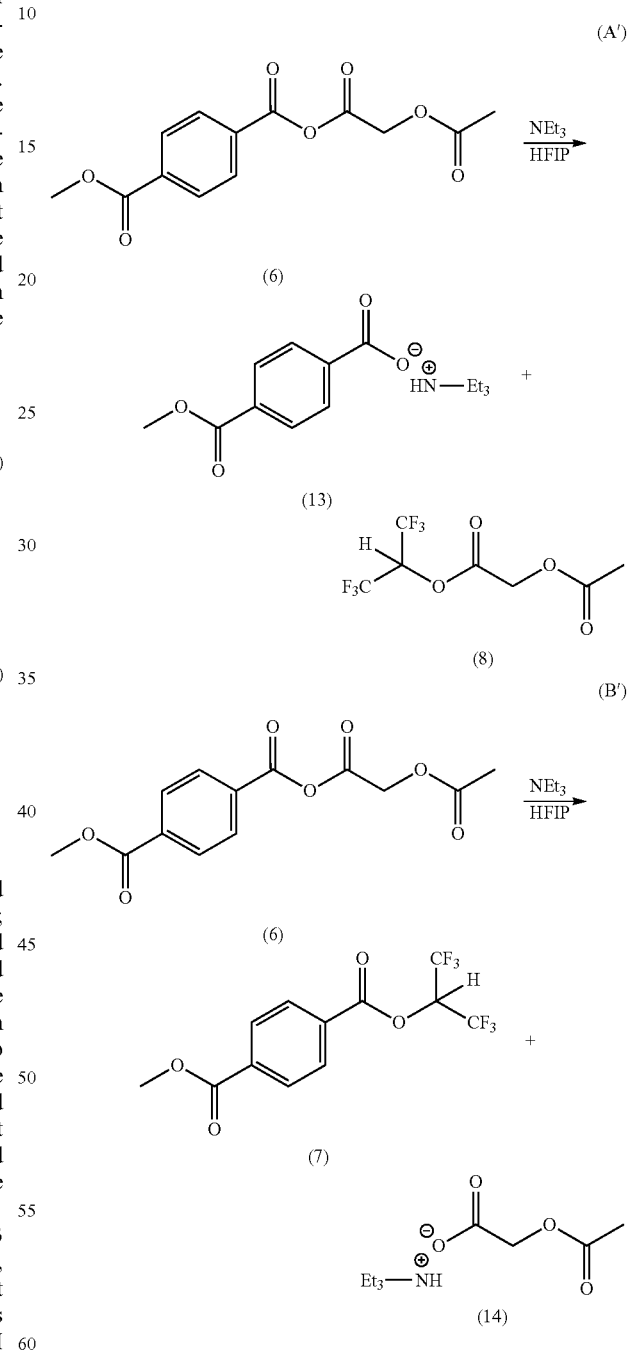

From the results of the above studies, in the first step, after obtaining the reaction product, the pretreatment liquid in which the reaction product is dissolved is concentrated, and in the second step, the concentrated pretreatment liquid in which the reaction product is dissolved is mixed into the solvent to fabricate the sample liquid.

Hereinafter, description will be given using the results of experiments.

Experiment 1

In a pretreatment liquid obtained by adding triethylamine as the organic base to HFIP, 3 mg of the sample 5 was dissolved by stirring for 5 minutes. As a result, a reaction product of the sample 5 is obtained in the pretreatment liquid. Next, the solvent of the pretreatment liquid in which the sample 5 was dissolved and stirred for 5 minutes was volatilized and concentrated to 12 mg. After dissolving this concentrated liquid in the measurement solvent 3 to fabricate a sample liquid, a 1H NMR measurement was carried out at a temperature of the sample liquid of T=50° C., and the peaks of (h) and (j) were confirmed.

(h), (j): δ6.00 ppm

Substituting the integrated values of the peaks into the concentration calculation equation, "C=4×{h+j}/{a+c+c'+i+i'}×100=4×0.32/43.28×100=3.0" was obtained, and thus the molar concentration of the acid anhydride structure relative to the entire aromatic rings was calculated to be about 3.0 mol %. Note that, although polyethylene terephthalate was used as the sample for the thermoplastic polyester in Experiment 1, it can be readily analogized that the measurement method mentioned above can also be applied to polybutylene terephthalate (PBT), polyneopentyl terephthalate (PNT), polyneopentyl isophthalate, and copolymers thereof.

Experiment 2: Changing the Organic Base in Experiment 1 to Pyridine

In a pretreatment liquid obtained by adding pyridine as the organic base to HFIP, 3 mg of the sample 5 was dissolved by stirring for 5 minutes. As a result, a reaction product of the sample 5 is obtained in the pretreatment liquid. Next, the solvent of the pretreatment liquid in which the sample 5 was dissolved and stirred for 5 minutes was volatilized and concentrated to 12 mg. After dissolving this concentrated liquid in the measurement solvent 3 to fabricate a sample liquid, a 1H NMR measurement was carried out at a temperature of the sample liquid of T=50° C. The same measurement results were obtained as in Experiment 1.

As the organic base, tertiary amines as typified by triethylamine and heterocyclic amines as typified by pyridine can be utilized, and it can be readily analogized that tripropylamine, tributylamine, N-ethyldiisopropylamine, pyrrole, imidazole, triazole, and the like can also be utilized.

Experiment 3: Changing the Relationship w/W Between the Mass w of the Sample in Experiment 1 and the Mass W of the Concentrated Pretreatment Liquid The measurements were conducted changing the value of w/W in Experiment 1, and the results of the calculation of the acid anhydride concentration are shown in Table 2. When w/W>0.5, the calculated results of the molar concentration C were smaller than those in the case of w/W 0.5. This is because the peak integrated values of (h) and (j) were small, and for w/W>0.5, as described in the study 2, the HFIP portions of the compound (8) and the compound (9) are believed to have been desorbed. On the other hand, in the case of w/W<0.1, the peaks of (h) and (j) were detected, but distortion of the baseline was observed in the whole spectrum. This is thought to be because the measurement solution contained a large amount of undeuterated HFIP, which resulted in the observation of a strong signal of HFIP protons. From the above results, it can be said that 0.1 w/W 0.5 is the desirable range of application for the method for measuring the acid anhydride content.

TABLE 2

1H NMR measurement results with mixed solvent of CDCl$_3$/HFIP-2d

| w/W | Detection of (h) and (j) | Calculated results of C | Usability as pretreatment |
|---|---|---|---|
| 1 | trace | — | Impossible |
| 0.6 | Detected | 1 | Impossible |
| 0.5 | Detected | 3 | Possible |
| 0.3 | Detected | 3 | Possible |
| 0.2 | Detected | 3 | Possible |
| 0.1 | Detected | 3 | Possible |
| 0.05 | Detected, but baseline failure | 4 | Impossible |
| 0.02 | Detected, but baseline failure | 2 | Impossible |

Experiment 4: Changing the Value of the Temperature of the Sample Liquid T° C. in the Measurement in Experiment 1

The measurements were conducted changing the value of the temperature of the sample liquid T, and the results of confirming the stability of the baseline of the NMR measurement chart are shown in Table 3. The baseline was not stable at T=20° C. This is thought to be because the admixing of HFIP and chloroform was not sufficient at T=20. Also, the baseline was not stable at T=55. This is thought to be because the boiling point of HFIP is 58° C., and when the NMR measurement is conducted at 55° C., a small amount of HFIP is vaporized in the sample tube for measurement, which accommodates the sample liquid, and the mixing ratio with chloroform cannot be constant.

The method for measuring the acid anhydride content according to embodiments of the present invention is intended to measure (quantify) the acid anhydride content in a polyester, and therefore, it is necessary to repeat the integration in the NMR measurement, and if the baseline deviates during the repeated integration, the accuracy of the measurement is reduced. From the results shown in Table 3, it can be said that 30≤T≤50 is suitably used as the temperature of the sample liquid Tin the measurement.

TABLE 3

Temperature of the sample liquid T (° C.) in the NMR measurement and quality of baseline

| T | Quality of baseline |
|---|---|
| 20 | Poor |
| 30 | Good |
| 40 | Good |
| 50 | Good |
| 55 | Poor |

As described above, according to embodiments of the present invention, a sample formed of a polyester or decomposition products of a polyester is dissolved in a pretreatment liquid containing 1,1,1,3,3,3-hexafluoro-2-propanol and an organic base to obtain a reaction product of the sample, which enables the content of acid anhydride in the degraded polyester to be measured. It was difficult for the existing measurement method to measure the content of an acid anhydride structure contained in a thermoplastic polyester. In order to detect a molecular structure that is difficult to be measured directly, it is considered to convert the molecular structure to be detected into a detectable molecular structure, but the choice of this conversion reaction is important. This is because the thermoplastic polyester contains, in addition to the acid anhydride structure, carboxylic acid and hydroxy groups as functional groups (substituents) that can be chemically converted.

The present inventors were interested in 1,1,1,3,3,3-hexafluoro-2-propanol (HFIP) as a reagent that can chemically convert an acid anhydride structure in a polyester in a selective manner. HFIP is not a chemical that is commonly used in chemical modification, and thus the chemical conversion of the acid anhydride structure using HFIP is a new pretreatment method.

By the way, when the chemical conversion using HFIP was tried, it was revealed that, if all the reaction solution used in the pretreatment was removed, as is generally done in pretreatment work, the desired compound could not be obtained. The present inventors considered that this was because removing all the reaction solution would cause the compound after the chemical conversion to be decomposed. Based on this consideration, the present inventors have made diligent studies on the pretreatment conditions and have revealed that, by conducting the NMR measurement with a small amount of the reaction solution, in which the chemical conversion of the acid anhydride structure have been conducted, being preserved, it is possible to detect a compound formed by the chemical conversion of the acid anhydride structure and to quantify the content of the acid anhydride structure.

Note that the present invention is not limited to the embodiments described above, and it is obvious that those having ordinary skill in the art can make many modifications and combinations without departing from the technical idea of the invention.

The invention claimed is:

1. A method for measuring an acid anhydride content, comprising:
    a first step of dissolving a sample in a pretreatment liquid to obtain a reaction product of the sample, the sample being formed of a polyester or decomposition products of a polyester, and the pretreatment liquid containing 1,1,1,3,3,3-hexafluoro-2-propanol and an organic base;
    a second step of mixing the reaction product of the sample into a solvent to fabricate a sample liquid, the solvent containing deuterated chloroform and deuterated 1,1,1,3,3,3-hexafluoro-2-propanol; and
    a third step of measuring an amount of the reaction product in the sample liquid through a nuclear magnetic resonance spectroscopy aiming at hydrogen atoms to determine an amount of an acid anhydride structure in the sample.

2. The method for measuring an acid anhydride content according to claim 1, wherein the organic base is a tertiary amine or a heterocyclic amine.

3. The method for measuring an acid anhydride content according to claim 2,
    wherein, in the first step, after obtaining the reaction product, the pretreatment liquid in which the reaction product is dissolved is concentrated to obtain a concentrated pretreatment liquid;
    wherein, in the second step, the concentrated pretreatment liquid is mixed into the solvent to fabricate the sample liquid; and
    wherein a ratio w/W of a mass of the sample to a mass of the concentrated pretreatment liquid satisfies a relationship of $0.1 \leq w/W \leq 0.5$.

4. The method for measuring an acid anhydride content according to claim 1,
    wherein, in the first step, after obtaining the reaction product, the pretreatment liquid in which the reaction product is dissolved is concentrated to obtain a concentrated pretreatment liquid;
    wherein, in the second step, the concentrated pretreatment liquid is mixed into the solvent to fabricate the sample liquid; and
    wherein a ratio w/W of a mass of the sample to a mass of the concentrated pretreatment liquid satisfies a relationship of $0.1 \leq w/W \leq 0.5$.

5. The method for measuring an acid anhydride content according to claim 1, wherein the measurement of an amount of the reaction product in the sample liquid through a nuclear magnetic resonance spectroscopy aiming at hydrogen atoms is conducted while setting a temperature of the sample liquid at 30° C. or higher and 50° C. or lower.

6. A method for measuring an acid anhydride content, comprising:
    dissolving a sample in a pretreatment liquid to obtain a reaction product of the sample, the sample being polyester, and the pretreatment liquid containing 1,1,1,3,3,3-hexafluoro-2-propanol and an organic base;
    mixing the reaction product of the sample into a solvent to fabricate a sample liquid, the solvent containing deuterated chloroform and deuterated 1,1,1,3,3,3-hexafluoro-2-propanol; and
    measuring an amount of the reaction product in the sample liquid through a nuclear magnetic resonance spectroscopy process.

7. The method of claim 6, wherein the nuclear magnetic resonance spectroscopy process detects hydrogen atoms to determine an amount of an acid anhydride structure in the sample.

8. The method for measuring an acid anhydride content according to claim 6, wherein the organic base is a tertiary amine or a heterocyclic amine.

9. The method for measuring an acid anhydride content according to claim 6,
    wherein after obtaining the reaction product, the pretreatment liquid in which the reaction product is dissolved is concentrated to obtain a concentrated pretreatment liquid;
    wherein the concentrated pretreatment liquid is mixed into the solvent to fabricate the sample liquid; and
    wherein a ratio w/W of a mass of the sample to a mass of the concentrated pretreatment liquid satisfies a relationship of $0.1 \leq w/W \leq 0.5$.

10. The method for measuring an acid anhydride content according to claim 6, wherein the measurement of an amount of the reaction product in the sample liquid is conducted while setting a temperature of the sample liquid at 30° C. or higher and 50° C. or lower.

11. A method for measuring an acid anhydride content, comprising:
    dissolving a sample in a pretreatment liquid to obtain a reaction product of the sample, the sample being comprising one or more decomposition products of a polyester, and the pretreatment liquid containing 1,1,1,3,3,3-hexafluoro-2-propanol and an organic base;
    mixing the reaction product of the sample into a solvent to fabricate a sample liquid, the solvent containing deuterated chloroform and deuterated 1,1,1,3,3,3-hexafluoro-2-propanol; and measuring an amount of the reaction product in the sample liquid through a nuclear magnetic resonance spectroscopy aiming at hydrogen atoms to determine an amount of an acid anhydride structure in the sample.

12. The method for measuring an acid anhydride content according to claim 11, wherein the organic base is a tertiary amine or a heterocyclic amine.

* * * * *